US012488964B2

(12) United States Patent
Hirayama

(10) Patent No.: US 12,488,964 B2
(45) Date of Patent: Dec. 2, 2025

(54) PLASMA PROCESSING APPARATUS AND PLASMA PROCESSING METHOD

(71) Applicants: TOKYO ELECTRON LIMITED, Tokyo (JP); TOHOKU UNIVERSITY, Miyagi (JP)

(72) Inventor: Masaki Hirayama, Tokyo (JP)

(73) Assignees: Tokyo Electron Limited, Tokyo (JP); Tohoku University, Miyagi (JP)

( * ) Notice: Subject to any disclaimer, the term of this patent is extended or adjusted under 35 U.S.C. 154(b) by 858 days.

(21) Appl. No.: 17/298,119

(22) PCT Filed: Nov. 26, 2019

(86) PCT No.: PCT/JP2019/046231
§ 371 (c)(1),
(2) Date: May 28, 2021

(87) PCT Pub. No.: WO2020/116255
PCT Pub. Date: Jun. 11, 2020

(65) Prior Publication Data

US 2022/0020569 A1 Jan. 20, 2022

(30) Foreign Application Priority Data

Dec. 6, 2018 (JP) ................................ 2018-229239

(51) Int. Cl.
*H01L 21/00* (2006.01)
*H01J 37/32* (2006.01)

(52) U.S. Cl.
CPC .. *H01J 37/32339* (2013.01); *H01J 37/32229* (2013.01); *H01J 37/32532* (2013.01); *H01J 2237/30405* (2013.01)

(58) Field of Classification Search
None
See application file for complete search history.

(56) References Cited

U.S. PATENT DOCUMENTS 4,342,901 A 8/1982 Zajac
5,820,947 A 10/1998 Itoh
(Continued)

FOREIGN PATENT DOCUMENTS

JP 3-19332 A 1/1991
JP H8-236448 A 9/1996
(Continued)

*Primary Examiner* — Parviz Hassanzadeh
*Assistant Examiner* — Michelle Crowell
(74) *Attorney, Agent, or Firm* — Nath, Goldberg & Meyer; Jerald L. Meyer; Tanya E. Harkins

(57) ABSTRACT

In an example of an embodiment, a plasma processing apparatus includes a processing container, a stage, an upper electrode, an inlet, and a waveguide device. The stage is provided within the processing container. The upper electrode is provided above the stage, to interpose a space within the processing container. The inlet is configured to introduce high-frequency waves. The high-frequency waves are VHF waves or UHF waves. The inlet is provided at an end of the space in the lateral direction, and extends in a circumferential direction around a central axis of the processing container. The waveguide device is configured to supply high-frequency waves to the inlet. The waveguide device includes a resonator that provides a waveguide. The waveguide of the resonator extends in the circumferential direction around the central axis and extends in the direction in which the central axis extends to be connected to the inlet.

11 Claims, 7 Drawing Sheets

(56) References Cited

U.S. PATENT DOCUMENTS

| | | | | |
|---|---|---|---|---|
| 5,904,487 | A | 5/1999 | Conboy et al. | |
| 5,997,686 | A | 12/1999 | Lardon et al. | |
| 6,228,438 | B1 | 5/2001 | Schmitt | |
| 8,382,941 | B2 | 2/2013 | Harrington | |
| 11,854,772 | B2 * | 12/2023 | Hirayama | H01J 37/32513 |
| 11,923,170 | B2 * | 3/2024 | Kawakami | H01J 37/32568 |
| 12,087,552 | B2 * | 9/2024 | Hirayama | H05H 1/46 |
| 2001/0026575 | A1 | 10/2001 | Sato et al. | |
| 2002/0104482 | A1 | 8/2002 | Kazumi | |
| 2002/0108933 | A1 * | 8/2002 | Hoffman | H01J 37/32183 219/121.4 |
| 2003/0089314 | A1 | 5/2003 | Matsuki et al. | |
| 2003/0178143 | A1 * | 9/2003 | Perrin | H01J 37/32192 118/723 MW |
| 2009/0140828 | A1 * | 6/2009 | Shannon | H01J 37/32091 333/235 |
| 2011/0162582 | A1 | 7/2011 | Ellert et al. | |
| 2011/0162799 | A1 | 7/2011 | Hayashi | |
| 2013/0292057 | A1 * | 11/2013 | Ramaswamy | H01J 37/32532 156/345.44 |
| 2014/0225503 | A1 * | 8/2014 | Mori | H01L 21/67069 315/111.21 |
| 2014/0339981 | A1 | 11/2014 | Komatsu et al. | |
| 2015/0075716 | A1 * | 3/2015 | Ramaswamy | H01J 37/32458 315/111.21 |
| 2016/0276134 | A1 * | 9/2016 | Collins | H01J 37/3255 |
| 2022/0020569 | A1 | 1/2022 | Hirayama | |
| 2023/0010178 | A1 * | 1/2023 | Hirayama | H01P 7/06 |
| 2024/0071730 | A1 * | 2/2024 | Hirayama | H01J 37/32623 |
| 2024/0242934 | A1 * | 7/2024 | Hirayama | H01J 37/32229 |
| 2024/0242936 | A1 * | 7/2024 | Hirayama | H01J 37/32247 |
| 2024/0242937 | A1 * | 7/2024 | Hirayama | H01J 37/32256 |

FOREIGN PATENT DOCUMENTS

| | | | |
|---|---|---|---|
| JP | 2000269146 | A | 9/2000 |
| JP | 2000299198 | A | 10/2000 |
| JP | 2003506889 | A | 2/2003 |
| JP | 2003243376 | A | 8/2003 |
| JP | 2007-217738 | A | 8/2007 |
| JP | 2011-103238 | A | 5/2011 |
| JP | 2014003179 | A | 1/2014 |
| KR | 10-0792314 | B1 | 1/2008 |

* cited by examiner

PLASMA PROCESSING APPARATUS AND PLASMA PROCESSING METHOD

This is a National Phase Application filed under 35 U.S.C. 371 as a national stage of PCT/JP2019/046231, filed Nov. 26, 2019, an application claiming the benefit of Japanese Application No. 2018-229239, filed Dec. 6, 2018, the content of each of which is hereby incorporated by reference in its entirety.

TECHNICAL FIELD

Exemplary embodiments of the present disclosure relate to a plasma processing apparatus and a plasma processing method.

BACKGROUND

In manufacturing electronic devices, a plasma processing apparatus is used. A type of a plasma processing apparatus is described in Patent Document 1. The plasma processing apparatus described in Patent Document 1 includes a processing container, a sample table, a disk-shaped member, a cavity resonator, and a waveguide. The processing container provides a processing chamber therein. The sample table is disposed within the processing chamber. The disk-shaped member is made of a dielectric material. The disk-shaped member is provided above the processing chamber. The cavity resonator is provided on the disk-shaped member. The waveguide is connected to the cavity resonator. In the plasma processing apparatus described in Patent Document 1, an electric field is supplied from the waveguide to the cavity resonator in order to generate plasma. The electric field supplied to the cavity resonator passes through the disk-shaped member, and is supplied to the processing chamber.

PRIOR ART DOCUMENTS

Patent Documents

Patent Document 1: Japanese Laid-Open Patent Publication No. 2011-103238

A plasma processing apparatus is required to improve uniformity of plasma density distribution in a circumferential direction within a processing container.

SUMMARY

In an exemplary embodiment, a plasma processing apparatus is provided. The plasma processing apparatus includes a processing container, a stage, an upper electrode, an inlet, and a waveguide device. The stage is provided within the processing container. The upper electrode is provided above the stage, to interpose a space within the processing container. The inlet is configured to introduce high-frequency waves. The high-frequency waves are VHF waves or UHF waves. The inlet is provided at an end of the space in the lateral direction, and extends in a circumferential direction around a central axis of the processing container. The waveguide device is configured to supply high-frequency waves to the inlet. The waveguide device includes a resonator that provides a waveguide. The waveguide of the resonator extends in the circumferential direction around the central axis and extends in the direction in which the central axis extends to be connected to the inlet.

According to the plasma processing apparatus according to one exemplary embodiment, it is possible to improve the uniformity of the plasma density distribution in the circumferential direction within the processing container.

DETAILED DESCRIPTION

Figure 1:
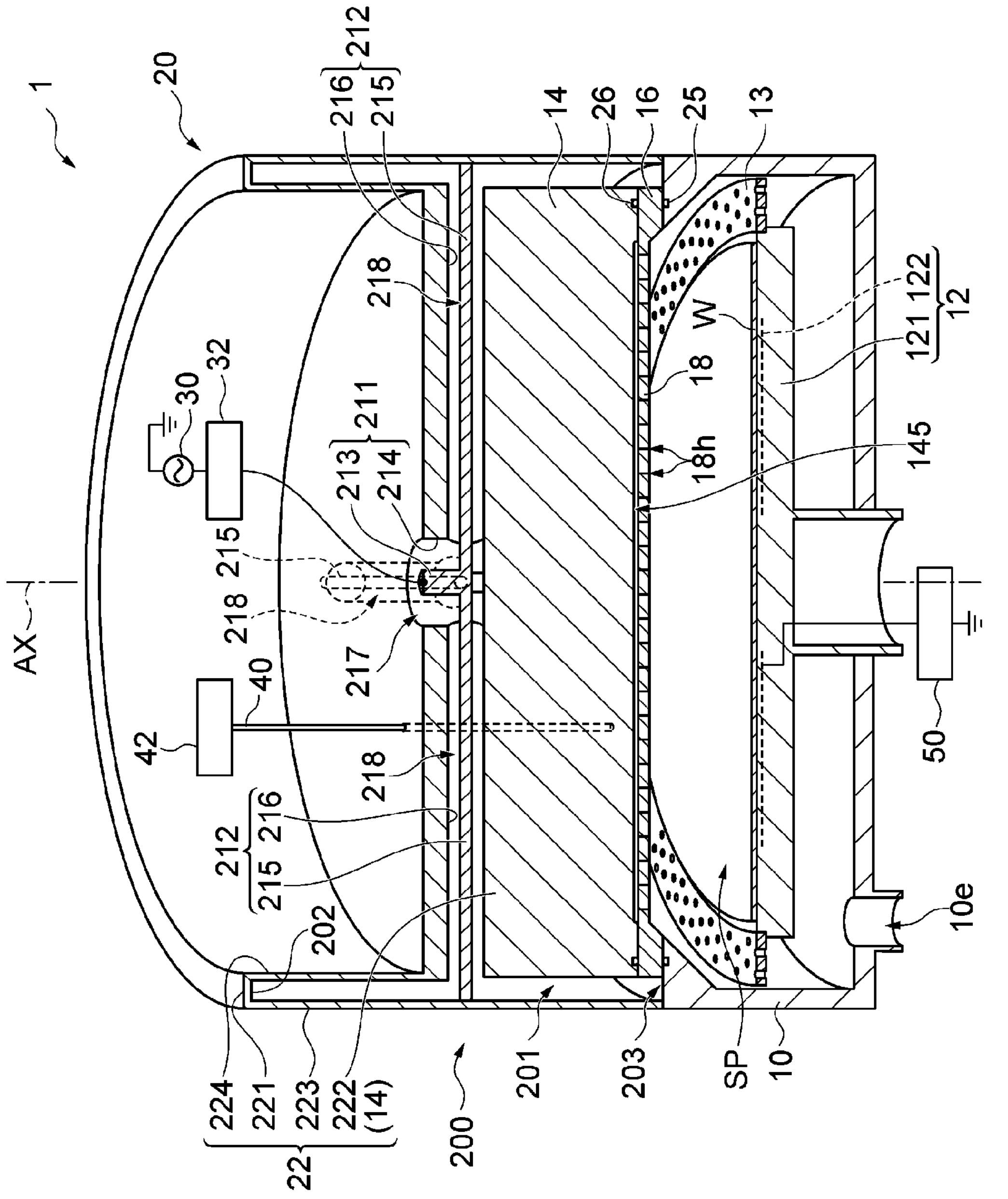
FIG. 1 is a view schematically illustrating a plasma processing apparatus according to an exemplary embodiment.

Hereinafter, various exemplary embodiments will be described.

In an exemplary embodiment, a plasma processing apparatus is provided. The plasma processing apparatus includes a processing container, a stage, an upper electrode, an inlet, and a waveguide device. The stage is provided within the processing container. The upper electrode is provided above the stage, to interpose a space within the processing container. The inlet is configured to introduce high-frequency waves. The high-frequency waves are VHF waves or UHF waves. The inlet is provided at an end of the space in a lateral direction, and extends in a circumferential direction around a central axis of the processing container. The waveguide device is configured to supply high-frequency waves to the inlet. The waveguide device includes a resonator that provides a waveguide. The waveguide of the resonator extends in the circumferential direction around the central axis and extends in the direction in which the central axis extends to be connected to the inlet.

In the plasma processing apparatus according to the exemplary embodiment described above, the resonator provides the waveguide extending in the circumferential direction around the central axis and extending in the direction in which the central axis extends. This waveguide is connected to the waveguide device extending in the circumferential direction. Therefore, high-frequency waves are introduced into the space within the processing container from the inlet with uniform power in the circumferential direction. Thus, the uniformity of the plasma density distribution in the circumferential direction within the processing container is improved.

In an exemplary embodiment, the waveguide may have a tubular shape.

In an exemplary embodiment, the waveguide includes one end and the other end. The one end and the other end may be one end and another end of the waveguide in the direction along the central axis. A width of the waveguide between the one end and the other end may be about ½ of the free space wavelength of the high-frequency waves supplied to the waveguide. The other end of the waveguide may be connected to the waveguide device.

In an exemplary embodiment, the waveguide may be folded back in the direction in which the central axis extends.

In an exemplary embodiment, the waveguide device may include multiple coaxial waveguides. The multiple coaxial waveguides may extend radially with respect to the central axis, and may be connected to the waveguide of the resonator. The multiple coaxial waveguides may be arranged at equal intervals in the circumferential direction.

In an exemplary embodiment, the waveguide device may further include another coaxial waveguide. This coaxial waveguide extends on the central axis, and may be connected to the multiple coaxial waveguides.

In an exemplary embodiment, the plasma processing apparatus may further include a dielectric plate. The dielectric plate may be provided above the stage and below the upper electrode.

In an exemplary embodiment, the dielectric plate may be a shower plate configured to eject a gas into the processing container.

In an exemplary embodiment, the plasma processing apparatus may further include a pipe extending through the waveguide device in order to supply the gas to the shower plate. In this embodiment, a metal wall of the waveguide device may be grounded.

In another exemplary embodiment, a plasma processing method for performing plasma processing on a substrate using a plasma processing apparatus is provided. The plasma processing method includes process of supplying a gas to a space within the processing container of the plasma processing apparatus. The plasma processing method further includes process of introducing high-frequency waves into the space in order to perform plasma processing on a substrate placed on a stage within the processing container. The plasma processing apparatus is one of the plasma processing apparatuses according to various exemplary embodiments described above.

In the plasma processing method according to the above exemplary embodiment, uniformity of a plasma density distribution in the circumferential direction within the processing container is improved. Therefore, the uniformity of plasma processing on a substrate in the circumferential direction is improved.

Hereinafter, various exemplary embodiments will be described in detail with reference to the drawings. In each of the drawings, the same or corresponding parts will be denoted by the same reference numerals.

FIG. 1 is a view schematically illustrating a plasma processing apparatus according to an exemplary embodiment. The plasma processing apparatus 1 illustrated in FIG. 1 includes a processing container 10, a stage 12, an upper electrode 14, and an inlet 16.

The processing container 10 has a substantially cylindrical shape. The processing container 10 extends in a vertical direction. A central axis of the processing container 10 is an axis AX extending in a vertical direction. The processing container 10 is formed of a conductor such as aluminum or an aluminum alloy. A corrosion-resistant film is formed on the surface of the processing container 10. The corrosion-resistant film may be an yttrium oxide film, an yttrium fluoride oxide film, an yttrium fluoride film, or a ceramic film containing yttrium oxide, yttrium fluoride, and the like. The processing container 10 is grounded.

The stage 12 is provided within the processing container 10. The stage 12 is configured to support a substrate W placed substantially horizontally on a top surface thereof. The stage 12 has a substantially disk-like shape. A central axis of the stage 12 may substantially coincide with the axis AX. That is, the center of the stage 12 may be located on the axis AX.

Figure 2:
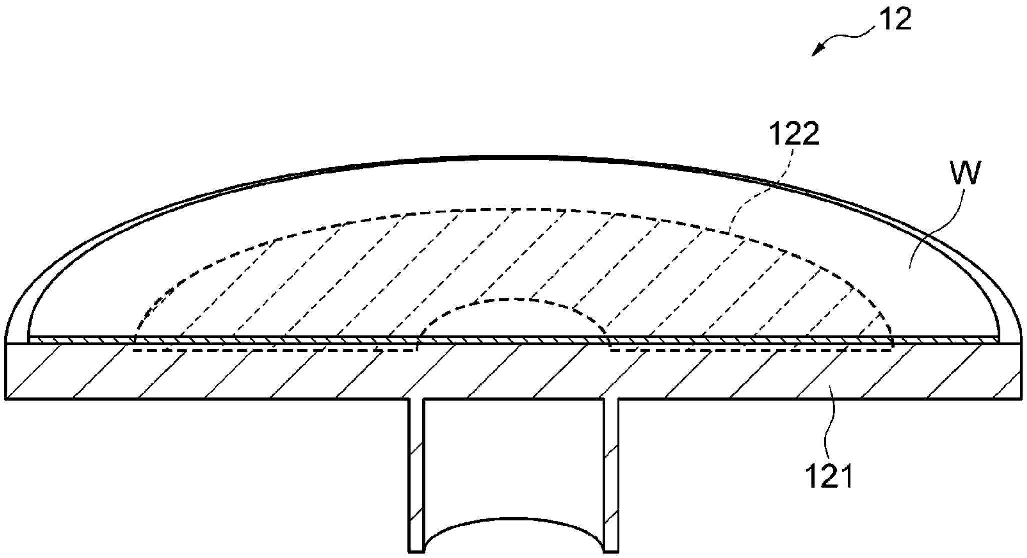
FIG. 2 is a broken perspective view illustrating an example of a stage.

Hereinafter, FIG. 2 is referenced together with FIG. 1. FIG. 2 is a broken perspective view illustrating an example of a stage. In an example, the stage 12 has a body 121 and a conductive layer 122. The body 121 is formed of an insulator such as aluminum nitride. The body 121 has a substantially disk-like shape. A central axis of the body 121 substantially coincides with the axis AX. That is, the axis AX includes the center of the stage 12.

The conductive layer 122 is formed of a conductive material such as tungsten or molybdenum. The conductive layer 122 is provided inside the body 121. The stage 12 may have one or more conductive layers. In this case, the conductive layer 122 has the shortest distance from the top surface of the stage 12 among one or more conductive layers provided in the stage 12.

The conductive layer 122 is formed in an annular shape around the axis AX. The inner diameter (diameter) of the conductive layer 122 is, for example, ⅙ of the diameter of a substrate W, that is, 50 mm or more. The outer diameter of the conductive layer 122 is smaller than the diameter of the substrate W. In an embodiment, the conductive layer 122 may be formed in a mesh shape.

In an embodiment, the conductive layer 122 is an electrode for electrostatic attraction. In this embodiment, a DC power source 50 is electrically connected to the conductive layer 122. When a DC voltage from the DC power source 50 is applied to the conductive layer 122, an electrostatic attractive force is generated between the stage 12 and the substrate W. The substrate W is attracted to the stage 12 by the generated electrostatic attractive force, and is held by the stage 12. In another embodiment, the conductive layer 122 may be a high-frequency electrode. In this case, a high-frequency power supply is electrically connected to the conductive layer 122 via a matcher. In yet another embodiment, the conductive layer 122 may be an electrode that is grounded.

As described above, the conductive layer 122 of the stage 12 is formed in an annular shape. Therefore, generation of an electric potential difference due to high-frequency waves between the central portion and the outer peripheral portion of the stage 12 is suppressed. As a result, generation of a high-frequency electric field between the central portion and the outer peripheral portion of the stage 12 is suppressed.

In an embodiment, the plasma processing apparatus 1 may further include a baffle member 13. The baffle member 13 extends between the stage 12 and a side wall of the processing container 10. The baffle member 13 is a substantially annular plate material. The baffle member 13 is formed of an insulator such as aluminum oxide. Multiple through holes are formed in the baffle member 13. The multiple through holes penetrate the baffle member 13 in a direction of plate thickness. An exhaust port **10*e* is formed in the processing container 10 below the stage 12. An exhaust apparatus is connected to the exhaust port 10*e***. The exhaust apparatus includes a pressure control valve and a vacuum pump such as a turbo molecular pump and/or a dry pump.

The upper electrode 14 is provided above the stage 12, with a space SP within the processing container 10 being interposed therebetween. The upper electrode 14 is formed of a conductor such as aluminum or an aluminum alloy. In an embodiment, the upper electrode 14 has a substantially disk-like shape. A central axis of the upper electrode 14 substantially coincides with the axis AX. The plasma processing apparatus 1 is configured to generate plasma in the space SP between the stage 12 and the upper electrode 14.

In an embodiment, the plasma processing apparatus 1 may further include a dielectric plate 18. The dielectric plate 18 is provided above the stage 12 and below the upper electrode 14. In an embodiment, the dielectric plate 18 is provided directly below the upper electrode 14. The dielectric plate 18 faces a top surface of the stage 12 with the space SP interposed therebetween. The space SP is a space between the dielectric plate 18 and the stage 12. Distance in a vertical direction between a bottom surface of the dielectric plate 18 and the top surface of the stage 12 is, for example, 5 cm or more and 30 cm or less. The dielectric plate 18 is formed of aluminum nitride, aluminum oxide, yttrium oxide, or a dielectric material containing aluminum nitride, aluminum oxide, yttrium oxide, and the like. A corrosion-resistant film may be formed at least on a bottom surface among surfaces of the dielectric plate 18. The corrosion-resistant film may be an yttrium oxide film, an yttrium fluoride oxide film, or a ceramic film containing yttrium oxide, yttrium fluoride, and the like. The dielectric plate 18 has a substantially disk-like shape. The central axis of the dielectric plate 18 substantially coincides with the axis AX.

In an embodiment, multiple gas discharge holes **18*h* are formed in the dielectric plate 18 in order to evenly supply a gas to the entire surface of a substrate W placed on the stage 12. That is, the dielectric plate 18 may be a shower plate configured to eject the gas. In an embodiment, the upper electrode 14 and the dielectric plate 18 are configured to provide a gap 145** therebetween.

In the plasma processing apparatus 1, an area of the inner wall surface of the processing container 10 extending above the baffle member 13 is substantially equal to a surface area of the dielectric plate 18 on the space SP side. That is, the area of a surface set to ground potential (a ground surface) among surfaces defining the space SP is substantially equal to an area of a surface provided by the dielectric plate 18 among surfaces defining the space SP. With this configuration, plasma is generated at a uniform density in an area directly below the dielectric plate 18 and an area near the ground surface. As a result, in-plane uniformity of the plasma processing of the substrate W is improved.

A thickness of a peripheral edge portion of the dielectric plate 18 is greater than a thickness of a central portion of the dielectric plate 18. The central portion of the dielectric plate 18 is a portion extending inward with respect to the peripheral edge portion of the dielectric plate 18. The peripheral edge portion of the dielectric plate 18 constitutes the inlet 16. That is, the inlet 16 has a ring shape. The inlet 16 is a portion that introduces high-frequency waves into the space SP. The high-frequency waves are VHF waves or UHF waves. The inlet 16 is provided at a lateral end portion of the space SP.

In an embodiment, the inlet 16 is elastically held between the upper electrode 14 and the upper end of the processing container 10. In an embodiment, a sealing member 25 is interposed between an upper end of the processing container 10 and the inlet 16. In addition, a sealing member 26 is interposed between the peripheral edge portion of the upper electrode 14 and the inlet 16. Each of the sealing member 25 and the sealing member 26 has elasticity. Each of the sealing member 25 and the sealing member 26 extends circumferentially around the axis AX. Each of the sealing member 25 and the sealing member 26 is, for example, an O-ring.

The plasma processing apparatus 1 further includes a waveguide device 20 in order to supply high-frequency waves to the inlet 16. The waveguide device 20 includes a resonator 200. In an embodiment, the resonator 200 may be a resonator. The resonator 200 provides a waveguide 201. The waveguide 201 extends circumferentially around the axis AX and extends in the direction in which the axis AX extends. The waveguide 201 is connected to the inlet 16. The waveguide 201 has a tubular shape extending in the vertical direction. A central axis of the waveguide 201 substantially coincides with the axis AX.

The waveguide 201 includes one end 202 and the other end 203. A width of the waveguide 201 between the one end 202 and the other end 203 is set such that the resonator 200 is in a resonant state. That is, the width of the waveguide 201 is set such that wavelength of electromagnetic waves propagating in the circumferential direction along the waveguide 201 becomes substantially infinite. In the present embodiment, since the inside of the waveguide 201 is hollow, the width of the waveguide 201 is about ½ of the wavelength of high-frequency waves (free space wavelength) that is used. When a dielectric material is provided inside the waveguide 201, the width of the waveguide 201 may be set to a value obtained by dividing ½ of the free space wavelength by the square root of effective permittivity in the waveguide 201. The other end 203 of the waveguide 201 is connected to the inlet 16.

In an embodiment, the waveguide 201 of the resonator 200 is provided by a main portion 22 of the resonator 200. The main portion 22 is formed of a conductor such as aluminum or an aluminum alloy. The main portion 22 includes an upper wall portion 221, a central portion 222, an outer cylindrical portion 223, and an inner cylindrical portion 224.

The upper wall portion 221 has a substantially annular plate shape. A central axis of the upper wall portion 221 substantially coincides with the axis AX. The outer cylindrical portion 223 and the inner cylindrical portion 224 have a substantially cylindrical shape. A central axis of each of the outer cylindrical portion 223 and the inner cylindrical portion 224 substantially coincides with the axis AX. The inner cylindrical portion 224 is provided radially inside the outer cylindrical portion 223. The inner cylindrical portion 224 extends downward from an inner edge of the upper wall portion 221. The outer cylindrical portion 223 extends downward from an outer edge of the upper wall portion 221. A lower end of the outer cylindrical portion 223 is connected to the upper end of the processing container 10. Therefore, the main portion 22 is grounded. The central portion 222 has a substantially disk-like shape. The central portion 222 extends downward and radially inward from a lower end of the inner cylindrical portion 224. In an embodiment, the central portion 222 constitutes the upper electrode 14.

The waveguide 201 of the resonator 200 is provided between the inner cylindrical portion 224 and the outer cylindrical portion and between an outer peripheral surface of the central portion 222 (the upper electrode 14) and the outer cylindrical portion 223 in the radial direction. In addition, the waveguide 201 is provided between the upper wall portion 221 and the upper end of the processing container 10 in the vertical direction.

In an embodiment, the waveguide device 20 may further include a first coaxial waveguide 211. The first coaxial waveguide 211 extends in the vertical direction such that a central axis thereof substantially coincides with the axis AX.

That is, the first coaxial waveguide 211 extends on the axis AX. The first coaxial waveguide 211 has an inner conductor 213. A high-frequency power supply 30 is electrically connected to the inner conductor 213 via a matcher 32. The high-frequency power supply 30 is a power supply that generates the above-mentioned high-frequency waves. The matcher 32 includes a matching circuit for matching impedance of a load of the high-frequency power supply 30 with the output impedance of the high-frequency power supply 30.

In an embodiment, the central portion 222 of the main portion 22 provides an outer conductor 214 of the first coaxial waveguide 211. Specifically, a hole 217 extending along the axis AX is formed in the central portion 222. The portion of the central portion 222 that defines the hole 217 is the outer conductor 214.

In an embodiment, the waveguide device 20 may further include multiple second coaxial waveguides 212. One end of each of the multiple second coaxial waveguides 212 is connected to the first coaxial waveguide 211. Each of the multiple second coaxial waveguides 212 extends radially with respect to the axis AX from one end thereof, and is connected to the waveguide 201 of the resonator 200. That is, multiple coaxial lines provided by the multiple second coaxial waveguides 212 are connected to the waveguide 201 of the resonator 200. The multiple second coaxial waveguides 212 are arranged at equal intervals in the circumferential direction with respect to the axis AX, that is, at an angular interval of about 360 degrees/N. "N" is the number of second coaxial waveguides 212. "N" is, for example, but is not limited to, 3 or 4.

In an embodiment, multiple holes 218 extending in the radial direction with respect to the axis AX are formed in the central portion 222. The multiple holes 218 are arranged at an angular interval of about 360 degrees/N in the circumferential direction with respect to the axis AX. As described above, "N" is the number of second coaxial waveguides 212. The portions that define the multiple holes 218 in the central portion 222 are outer conductors 216. In the multiple holes 218, multiple inner conductors 215, that is, inner conductors of the multiple second coaxial waveguides 212, extend respectively. The multiple inner conductors 215 branch from the inner conductor 213 and extend radially with respect to the axis AX. Each end of the multiple inner conductors 215 is connected to the outer cylindrical portion 223. Accordingly, the inner conductor 213 and the multiple inner conductors 215 are grounded. Therefore, the waveguide provided by the waveguide device 20 is composed of a grounded conductor, that is, a metal wall of the grounded waveguide device 20.

A pipe 40 is connected to the above-mentioned gap 145. A gas supply 42 is connected to the pipe 40. The gas supply 42 includes one or more gas sources used for processing the substrate W. Further, the gas supply 42 includes one or more flow controllers in order to control the flow rate of a gas from one or more gas sources.

The gas from the gas supply 42 is supplied to the gap 145 via the pipe 40. The gas supplied to the gap 145 is ejected into the space SP through the multiple gas discharge holes 18*h* of the dielectric plate 18. The pipe 40 extends to the gap 145 through a waveguide of the waveguide device 20. As described above, all of the waveguides provided by the waveguide device 20 are composed of grounded conductors. Therefore, the excitation of gas within the pipe 40 is suppressed.

In the plasma processing apparatus 1, high-frequency waves are supplied from the high-frequency power supply 30 to the inlet 16 through a waveguide of the waveguide device 20. The resonator 200 of the waveguide device 20 provides the waveguide 201 extending in the direction in which the axis AX extends and extending in the circumferential direction around the axis AX. The waveguide 201 is connected to the inlet 16 extending in the circumferential direction. The high-frequency waves are introduced into the space SP from the inlet 16 toward the axis AX. Since the resonator 200 provides the waveguide 201 having the width described above, the wavelength inside a tube in the longitudinal direction of the waveguide 201 (the circumferential direction of the axis AX) becomes infinite. As a result, an electric field having uniform strength and phase is applied to the inlet 16 in the circumferential direction. Accordingly, high-frequency waves are introduced into the space SP from the inlet 16 with uniform power in the circumferential direction. When high-frequency waves are introduced into the space SP, the gas is excited within the space SP, and plasma is generated from the gas. Accordingly, the plasma is generated in the space SP with a uniform density distribution in the circumferential direction. The substrate W on the stage 12 is processed according to chemical species from the plasma.

Hereinafter, a plasma processing method for performing plasma processing on a substrate using the plasma processing apparatus 1 will be described. In the plasma processing method, a substrate is placed on the stage 12. Next, in the plasma processing method, a gas is supplied to the space SP within the processing container 10. The gas is supplied from the gas supply 42 to the space SP. Next, in the plasma processing method, high-frequency waves are introduced into the space SP. The high-frequency waves are introduced into the space SP from the waveguide device 20 via the inlet 16. The high-frequency waves introduced into the space SP excite the gas within the space SP and generate plasma from the gas. The substrate is processed by the generated plasma. In this plasma processing method, uniformity of plasma density distribution in a circumferential direction within the processing container 10 is improved. Therefore, uniformity of plasma processing on a substrate in the circumferential direction is improved. In addition, this plasma processing method may be similarly carried out using plasma processing apparatuses of various embodiments to be described later.

Figure 3:
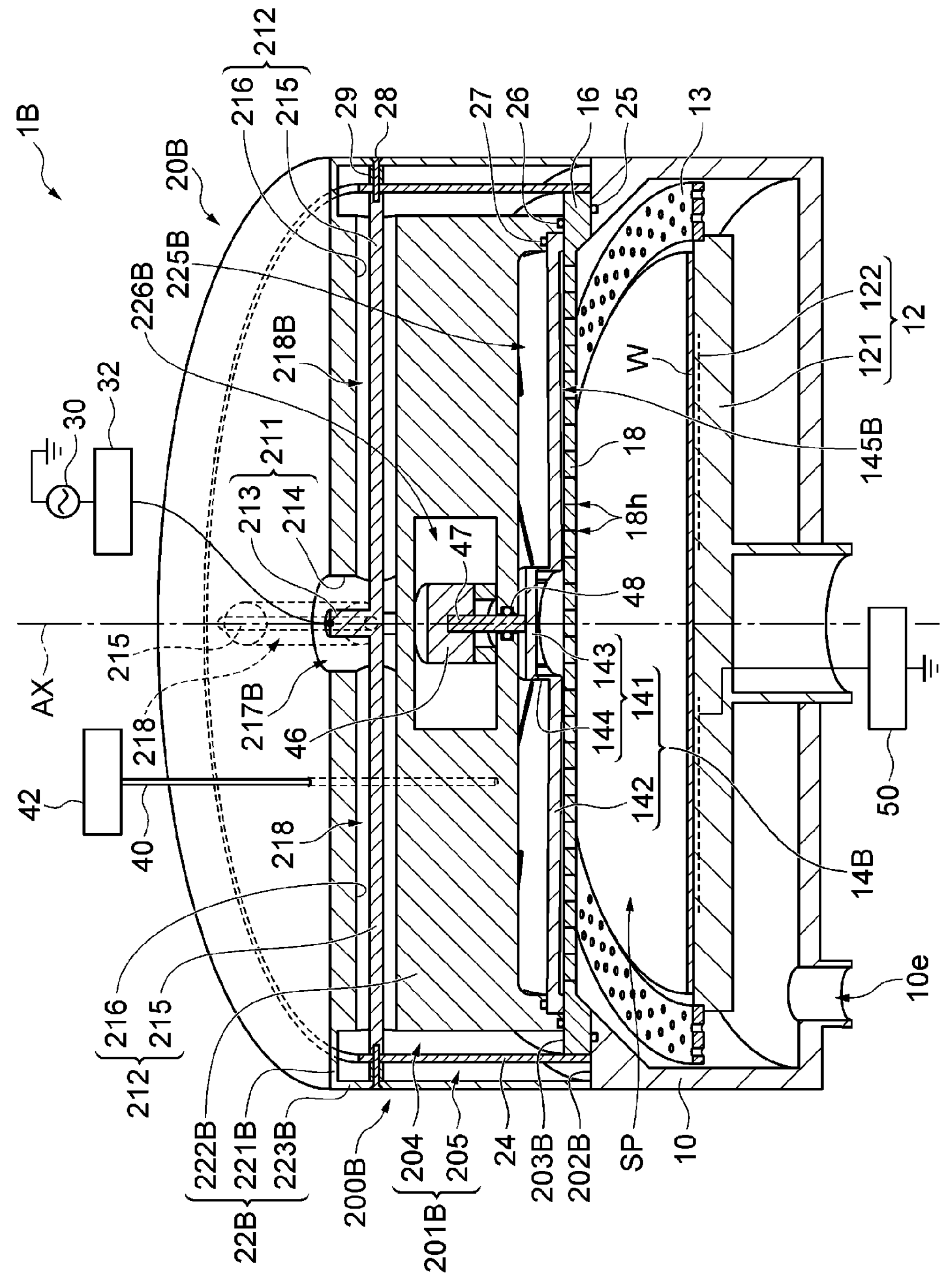
FIG. 3 is a view schematically illustrating a plasma processing apparatus according to another exemplary embodiment.

Hereinafter, a plasma processing apparatus 1B according to another exemplary embodiment will be described with reference to FIG. 3. FIG. 3 is a view schematically illustrating a plasma processing apparatus according to another exemplary embodiment. Hereinafter, configuration of the plasma processing apparatus 1B that is different from the configuration of the plasma processing apparatus 1 will be described.

The plasma processing apparatus 1B includes an upper electrode 14B in place of the upper electrode 14. The upper electrode 14B and a dielectric plate 18 are configured to provide a gap 145B therebetween. The upper electrode 14B is formed of a conductor such as aluminum or an aluminum alloy. The upper electrode 14B is flexible. The upper electrode 14B may be formed of a plate material made of a conductor. The upper electrode 14B may have a substantially circular planar shape. In an embodiment, the central axis of the upper electrode 14B substantially coincides with the axis AX. Details of the upper electrode 14B will be described later.

The plasma processing apparatus 1B further includes a waveguide device 20B in place of the waveguide device 20 in order to supply high-frequency waves to the inlet 16. The waveguide device 20B includes a resonator 200B. In an embodiment, the resonator 200B may be a cavity resonator. The resonator 200B provides a tubular waveguide 201B extending in the vertical direction. A central axis of the waveguide 201B substantially coincides with the axis AX. The waveguide 201B includes one end 202B and the other end 203B. A width of the waveguide 201B between one end 202B and the other end 203B is set such that wavelength of electromagnetic waves propagating in a circumferential direction along the waveguide 201B becomes substantially infinite. In the present embodiment, since inside of the waveguide 201B is hollow, the width of the waveguide 201B is about ½ of the wavelength of high-frequency waves (free space wavelength) that is used. When a dielectric material is provided inside the waveguide 201B, the width of the waveguide 201B may be set to a value obtained by dividing ½ of the free space wavelength by the square root of the effective permittivity in the waveguide 201B.

In an embodiment, the waveguide 201B includes an inner waveguide 204 and an outer waveguide 205. Each of the inner waveguide 204 and the outer waveguide 205 is a tubular waveguide extending in the vertical direction. The inner waveguide 204 extends radially inward with respect to the outer waveguide 205. A lower end of the outer waveguide 205 constitutes one end 202B of the waveguide 201B. An upper end of the outer waveguide 205 and an upper end of the inner waveguide 204 are continuous with each other. That is, the waveguide 201B is folded back in the direction in which the axis AX extends. The above-mentioned width of the waveguide 201B is the width of the folded waveguide 201B between the one end 202B and the other end 203B. A lower end of the inner waveguide 204 constitutes the other end 203B of the waveguide 201B. The other end 203B of the waveguide 201B is connected to the inlet 16.

In an embodiment, the waveguide 201B of the resonator 200B is provided by a main portion 22B and a cylindrical member 24. The main portion 22B is formed of a conductor such as aluminum or an aluminum alloy. The main portion 22B includes an upper wall portion 221B, a central portion 222B, and an outer cylindrical portion 223B. The upper wall portion 221B has a substantially circular thin plate shape. The upper wall portion 221B extends substantially horizontally. The central portion 222B has a substantially cylindrical shape. The central portion 222B extends downward from the upper wall portion 221B. A bottom surface of the central portion 222B defines a space 225B inside a peripheral edge portion of the central portion 222B. The space 225B is a gas diffusion space.

The inlet 16, that is, a peripheral edge portion of the dielectric plate 18, is elastically held between the peripheral edge portion of the central portion 222B and the upper end of the processing container 10. Specifically, a sealing member 25 is interposed between the upper end of the processing container 10 and the bottom surface of the inlet 16. A sealing member 26 is interposed between the peripheral edge of the central portion 222 and a top surface of the inlet 16.

A peripheral edge portion of the upper electrode 14B, in the radial direction with respect to the sealing member 26, is sandwiched between the peripheral edge portion of the central portion 222B, and the inlet 16. A conductive elastic member 27 (e.g., a spiral ring) is provided between the peripheral edge portion of the upper electrode 14B and the peripheral edge portion of the central portion 222B. The material of the conductive elastic member 27 is, for example, a metal such as stainless steel, Inconel, nickel, tungsten, tantalum, a copper alloy, or molybdenum. The conductive elastic member 27 may be covered with a protective film of nickel, aluminum, stainless steel, gold, or the like. The conductive elastic member 27 stably maintains electrical connection between the upper electrode 14B and the central portion 222B.

The outer cylindrical portion 223B has a substantially cylindrical shape. A central axis of the outer cylindrical portion 223B substantially coincides with the axis AX. The outer cylindrical portion 223B extends downward from the upper wall portion 221B at the radial outside of the central portion 222B. A lower end of the outer cylindrical portion 223B is connected to the upper end of the processing container 10. Therefore, the main portion 22B is grounded.

The cylindrical member 24 is formed of a conductor such as aluminum or an aluminum alloy. The cylindrical member 24 has a substantially cylindrical shape. A central axis of the cylindrical member 24 substantially coincides with the axis AX. The cylindrical member 24 extends in the vertical direction between the central portion 222B and the outer cylindrical portion 223B. A lower end of the cylindrical member 24 is connected to the upper end of the processing container 10. Therefore, the cylindrical member 24 is grounded. An upper end of the cylindrical member 24 is separated from the upper wall portion 221B.

The outer waveguide 205 extends between the outer cylindrical portion 223B and the cylindrical member 24. The outer waveguide 205 is terminated at the upper end of the processing container 10. The outer waveguide 205 and the inner waveguide 204 are connected between the upper end of the cylindrical member 24 and the upper wall portion 221B. The inner waveguide 204 extends between the cylindrical member 24 and the central portion 222B.

In the plasma processing apparatus 1B, the central portion 222B of the main portion 22B provides an outer conductor 214 of the first coaxial waveguide 211 and outer conductors 216 of the multiple second coaxial waveguides 212. Specifically, a hole 217B extending along the axis AX is formed in the central portion 222B. The portion of the central portion 222B that defines the hole 217B is the outer conductor 214. The inner conductor 213 of the first coaxial waveguide 211 extends along the center line of the hole 217B, that is, the axis AX.

Multiple holes 218B extending in the radial direction with respect to the axis AX are formed in the central portion 222B. The multiple holes 218B are arranged at an angular interval of about 360 degrees/N in the circumferential direction with respect to the axis AX. As described above, "N" is the number of second coaxial waveguides 212. The portions that define the multiple holes 218B in the central portion 222B are the outer conductors 216. In the multiple holes 218B, multiple inner conductors 215, that is, the inner conductors of the multiple second coaxial waveguides 212, are extended respectively. The multiple inner conductors 215 branch from the inner conductor 213 and extend radially with respect to the axis AX. An end of each of the multiple inner conductors 215 is connected to an upper end of the cylindrical member 24. Therefore, the inner conductor 213 and the multiple inner conductors 215 are grounded. Thus, waveguides provided by the waveguide device 20B are composed of grounded conductors.

The end of each of the multiple inner conductors 215 is connected to the upper end of the cylindrical member 24 by a screw 28. The screw 28 extends from the outer cylindrical portion 223B to an end of a corresponding inner conductor 215 among the multiple inner conductors 215, and is screwed into the corresponding inner conductor 215. A head of the screw 28 is in contact with the outer cylindrical portion 223B. The screw 28 is made of an insulator. The screw 28 is made of, for example, polytetrafluoroethylene. Multiple spacers 29 are provided between the cylindrical member 24 and the outer cylindrical portion 223B. Each of the multiple spacers 29 surrounds a corresponding screw 28 between the cylindrical member 24 and the outer cylindrical portion 223B. Each of the multiple spacers 29 is formed of an insulator. Each of the multiple spacers 29 is formed of, for example, polytetrafluoroethylene.

Figure 4:
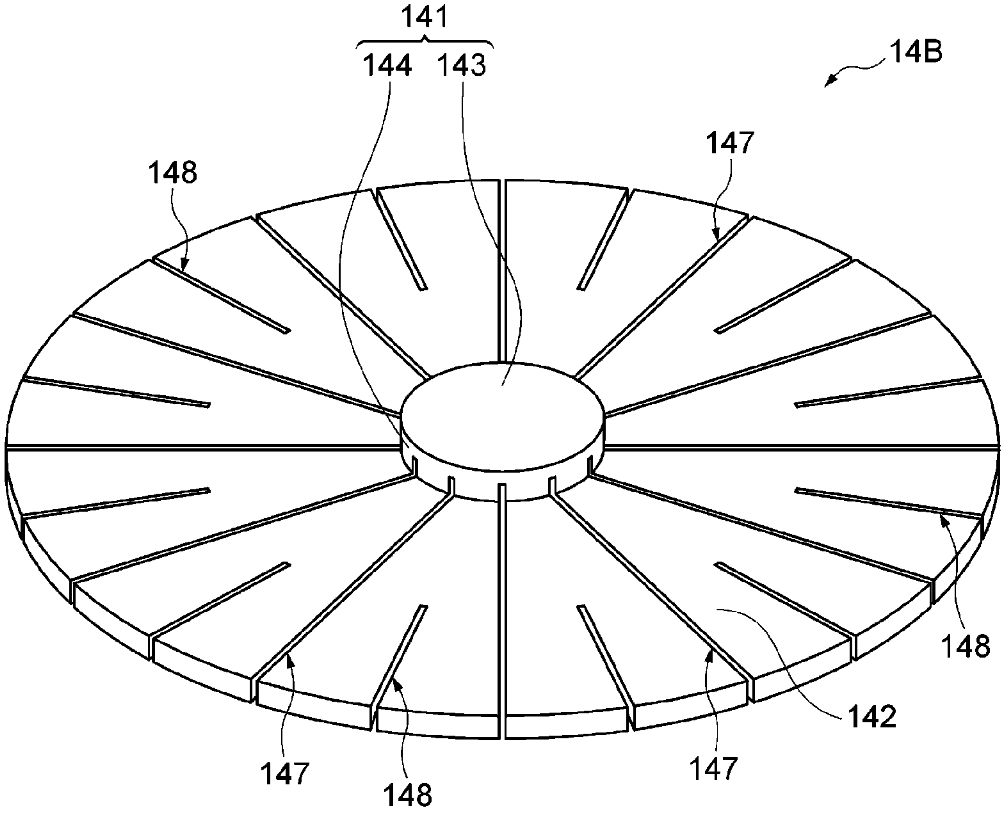
FIG. 4 is a perspective view illustrating an upper electrode according to an exemplary embodiment.

Hereinafter, FIG. 4 is referenced together with FIG. 3. FIG. 4 is a perspective view illustrating an upper electrode according to an exemplary embodiment. In an embodiment, the upper electrode 14B includes a first portion 141 and a second portion 142. The first portion 141 constitutes a central portion of the upper electrode 14B. The first portion 141 includes an upper wall 143 and a tubular wall 144. The upper wall 143 has a substantially disk-like shape. The upper wall 143 extends substantially horizontally. The tubular wall 144 has a substantially cylindrical shape. The tubular wall 144 extends downward from a peripheral edge portion of the upper wall 143. A thickness of the tubular wall 144 (the thickness in the radial direction) is smaller than a thickness of the upper wall 143 and a thickness of the second portion 142.

The second portion 142 has a substantially annular plate shape. The second portion 142 extends radially from a lower end of the tubular wall 144. A peripheral edge portion of the second portion 142 is a peripheral edge portion of the upper electrode 14B. A bottom surface of the upper electrode 14B defines a gap 145B between the bottom surface and the dielectric plate 18 and the inside of the peripheral edge portion of the upper electrode 14B.

Multiple first slits 147 and multiple second slits 148 are formed in the upper electrode 14B. The multiple first slits 147 and the multiple second slits 148 penetrate the upper electrode 14B. Each of the multiple first slits 147 extends in the radial direction from the tubular wall 144 to the peripheral edge of the upper electrode 14B. The multiple first slits 147 are arranged at an angular interval of, for example, 360 degrees/M in the circumferential direction. In addition, "M" is the number of multiple first slits 147.

Each of the multiple second slits 148 extends in the radial direction from a position between the tubular wall 144 and the peripheral edge of the upper electrode 14B to the peripheral edge of the upper electrode 14B. The multiple second slits 148 are arranged alternately with the multiple first slits 147 in the circumferential direction.

The pipe 40 is connected to the above-mentioned space 225B. The gas supply 42 is connected to the pipe 40. The pipe 40 extends into the space 225B through the waveguide of the waveguide device 20B. As described above, all of the waveguides provided by the waveguide device 20B are composed of a grounded conductor, that is, a metal wall of the grounded waveguide device 20B. Therefore, excitation of a gas within the pipe 40 is suppressed.

The space 225B is connected to the gap 145B via the multiple first slits 147 and the multiple second slits 148. The gas from the gas supply 42 is supplied to the space 225B through the pipe 40. The gas supplied to the space 225B is supplied to the gap 145B through the multiple first slits 147 and the multiple second slits 148. The gas supplied to the gap 145B is ejected into the space SP through the multiple gas discharge holes 18*h* in the dielectric plate 18.

In the plasma processing apparatus 1B, high-frequency waves are supplied from the high-frequency power supply 30 to the inlet 16 through the waveguide of the waveguide device 20B. The resonator 200B of the waveguide device 20B provides a waveguide 201B that extends in the direction in which the axis AX extends and extends circumferentially around the axis AX. The waveguide 201B is connected to the inlet 16 extending in the circumferential direction. The high-frequency waves are introduced into the space SP from the inlet 16 toward the axis AX. Since the resonator 200B provides the waveguide 201B having the width described above, the wavelength inside a tube in the longitudinal direction of the waveguide 201B (the circumferential direction of the axis AX) becomes infinite. As a result, an electric field having uniform strength and phase is applied to the inlet 16 in the circumferential direction. Accordingly, the high-frequency waves are introduced into the space SP from the inlet 16 with uniform power in the circumferential direction. When the high-frequency waves are introduced into the space SP, the gas is excited within the space SP, and plasma is generated from the gas. Accordingly, the plasma is generated in the space SP with uniform density distribution in the circumferential direction. The substrate W on the stage 12 is processed according to chemical species from the plasma.

The above-mentioned gap 145B includes a subspace defined by the first portion 141 and a subspace defined by the second portion 142. A vertical length of the subspace defined by the first portion 141 is greater than a vertical length of the subspace defined by the second portion 142. Therefore, radial non-uniformity in strength of an electric field formed by the high-frequency waves is reduced.

In an embodiment, a cavity 226B is formed in the central portion 222 of the waveguide device 20B. An actuator 46 is housed in the cavity 226B. From the actuator 46, a drive shaft 47 extends downward along the axis AX through the central portion 222. A sealing member 48 such as an O-ring is provided between the drive shaft 47 and the central portion 222. The drive shaft 47 is connected to the upper wall 143 of the first portion 141 of the upper electrode 14B. The actuator 46 generates power to move the upper wall 143 up and down. When the upper wall 143 is moved upward by the actuator 46, the length of the gap 145B in the vertical direction increases according to a length of distance from the axis AX. That is, by adjusting the position of the upper wall 143 in the vertical direction by the actuator 46, the length of the gap 145B in the vertical direction is adjusted according to the distance from the axis AX. Accordingly, strength of an electric field formed by the high-frequency waves is adjusted according to the radial distance from the axis AX. Therefore, plasma density distribution in the radial direction with respect to the axis AX is adjustable. For example, radial non-uniformity in strength of the electric field formed by the high-frequency waves can be eliminated, and non-uniformity of the plasma density distribution in the radial direction can be reduced.

As described above, the thickness of the tubular wall 144 of the upper electrode 14B is small. Accordingly, the upper electrode 14B is easily bent. Further, the multiple first slits 147 and the multiple second slits 148 described above are formed in the upper electrode 14B. Accordingly, the upper electrode 14B is more easily bent.

Figure 5:
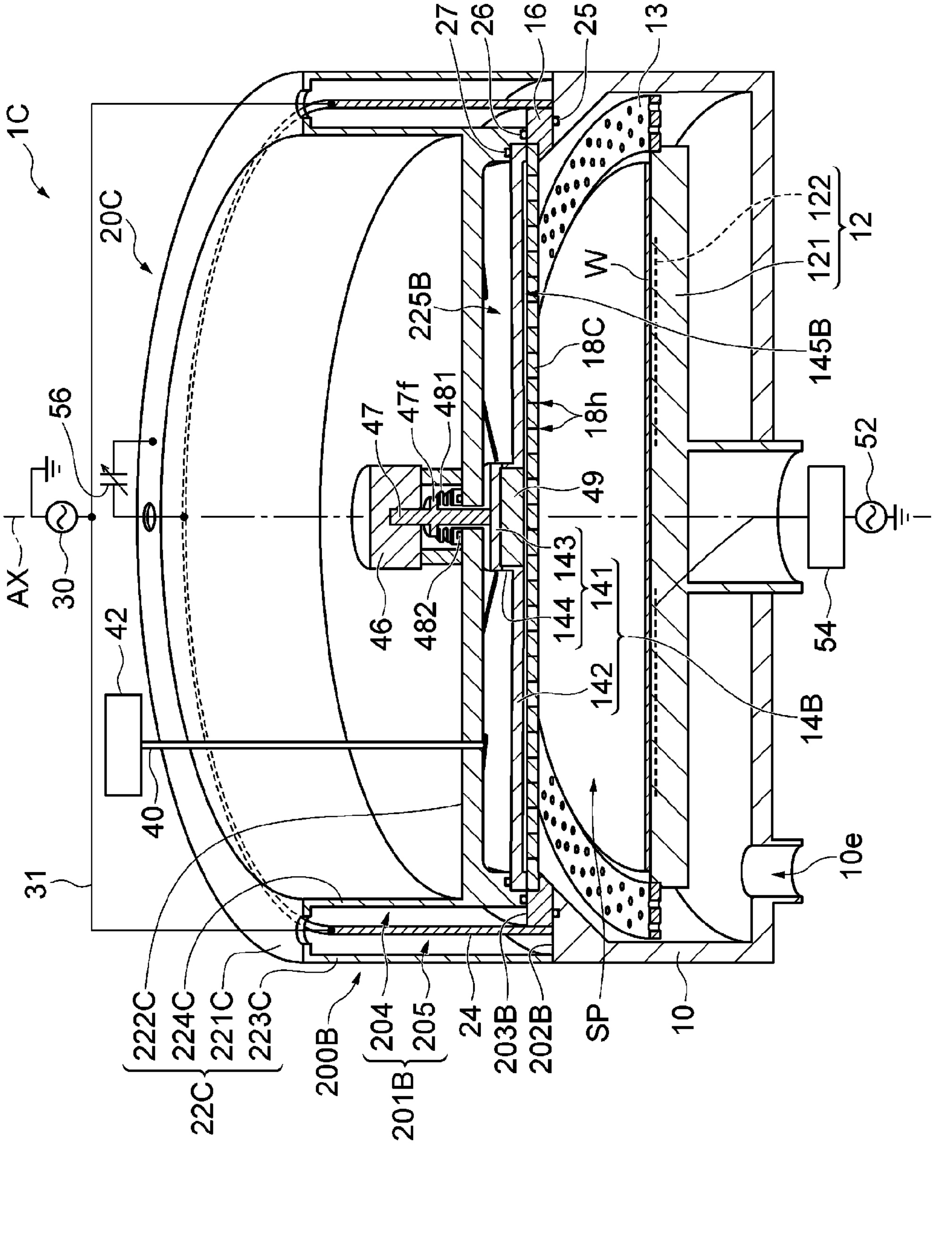
FIG. 5 is a view schematically illustrating a plasma processing apparatus according to yet another exemplary embodiment.

Hereinafter, a plasma processing apparatus 1C according to another exemplary embodiment will be described with reference to FIG. 5. FIG. 5 is a view schematically illustrating a plasma processing apparatus according to another exemplary embodiment. Hereinafter, configuration of the plasma processing apparatus 1C that is different from the configuration of the plasma processing apparatus 1B will be described.

The plasma processing apparatus 1C includes a dielectric plate 18C in place of the dielectric plate 18. The dielectric plate 18C is formed of aluminum nitride, aluminum oxide, yttrium oxide, or a dielectric material containing aluminum nitride, aluminum oxide, yttrium oxide, and the like. A corrosion-resistant film may be formed on at least a bottom surface among the surfaces of the dielectric plate 18C. The corrosion-resistant film may be an yttrium oxide film, an yttrium fluoride oxide film, an yttrium fluoride film, or a ceramic film containing yttrium oxide, yttrium fluoride, and the like. Similar to the dielectric plate 18, multiple gas discharge holes 18*h* are formed in the dielectric plate 18C. That is, in an embodiment, the dielectric plate 18C may be a shower plate configured to eject gas. The dielectric plate 18C has a substantially disk-like shape.

In the plasma processing apparatus 1C, an area of the inner wall surface of the processing container 10 extending above the baffle member 13 is substantially equal to a surface area of the dielectric plate 18C on the space SP side. That is, an area of the surface set to ground potential (a ground surface) among the surfaces defining the space SP is substantially equal to the area of the surface provided by the dielectric plate 18C among the surfaces defining the space SP.

In the plasma processing apparatus 1C, the inlet 16 is separate from the dielectric plate 18C. In the plasma processing apparatus 1C, the inlet 16 is a ring-shaped member. The inlet 16 is formed of a dielectric material such as aluminum nitride or aluminum oxide.

The plasma processing apparatus 1C includes a waveguide device 20C in place of the waveguide device 20B. The waveguide device 20C has a main portion 22C and a cylindrical member 24. The main portion 22C is formed of a conductor such as aluminum or an aluminum alloy. The main portion 22C includes an upper wall portion 221C, a central portion 222C, an outer cylindrical portion 223C, and an inner cylindrical portion 224C.

The upper wall portion 221C has a substantially annular plate shape. A central axis of the upper wall portion 221C substantially coincides with the axis AX. The outer cylindrical portion 223C and the inner cylindrical portion 224C have a substantially cylindrical shape. A central axis of each of the outer cylindrical portion 223C and the inner cylindrical portion 224C substantially coincides with the axis AX. The inner cylindrical portion 224C is provided radially inside the outer cylindrical portion 223C. The inner cylindrical portion 224C extends downward from an inner edge of the upper wall portion 221C. The outer cylindrical portion 223C extends downward from an outer edge of the upper wall portion 221C. The cylindrical member 24 extends between the outer cylindrical portion 223C and the inner cylindrical portion 224C. An upper end of the cylindrical member 24 is separated from the upper wall portion 221C.

The waveguide device 20C constitutes a resonator 200B. The inner waveguide 204 of the resonator 200B extends between the inner cylindrical portion 224C and the cylindrical member 24. The outer waveguide 205 of the resonator 200B extends between the outer cylindrical portion 223C and the cylindrical member 24. The outer waveguide 205 and the inner waveguide 204 are connected to each other through a gap between the upper end of the cylindrical member 24 and the upper wall portion 221C. The inner waveguide 204 is connected to the inlet 16. The inlet 16 is sandwiched between a peripheral portion of the central portion 222C and the upper end of the processing container 10 via the sealing member 25 and the sealing member 26. The central portion 222C has a substantially disk-like shape. The central portion 222C extends radially inward from a lower end of the inner cylindrical portion 224C. The central portion 222C and the upper electrode 14B provide a space 225B therebetween.

In the plasma processing apparatus 1C, the high-frequency power supply 30 is electrically connected to the cylindrical member 24. In an embodiment, the high-frequency power supply 30 is electrically connected to an upper portion of the cylindrical member 24 via a coaxial cable 31. A variable capacitor 56 is connected between the cylindrical member 24 and the main portion 22C. Capacitance of the variable capacitor 56 is adjusted so as to cause high-frequency resonance in the resonator 200B. Since the variable capacitor 56 is used in the plasma processing apparatus 1C, the high-frequency power supply 30 may be electrically connected to the cylindrical member 24 without the intervention of a matcher.

The plasma processing apparatus 1C may further include a dielectric member 49. The dielectric member 49 is provided in a space so as to fill a space surrounded by the upper wall 143 and the tubular wall 144 of the first portion 141 of the upper electrode 14B. The dielectric member 49 suppresses the occurrence of electric discharge in the space.

In the plasma processing apparatus 1C, the drive shaft 47 has a flange 47*f*. The flange 47*f* is provided between an upper end and a lower end of the drive shaft 47. A bellows 481 is provided between the flange 47*f* and the central portion 222C. The bellows 481 may be formed of, for example, aluminum, an aluminum alloy, or stainless steel. A sealing member 482 such as an O-ring is provided between the bellows 481 and the central portion 222C.

In the plasma processing apparatus 1C, the conductive layer 122 of the stage 12 is a high-frequency electrode. A high-frequency power supply 52 is electrically connected to the conductive layer 122 via a matcher 54. The matcher 54 includes a matching circuit for matching impedance of a load of the high-frequency power supply 52 with output impedance of the high-frequency power supply 52.

Figure 6:
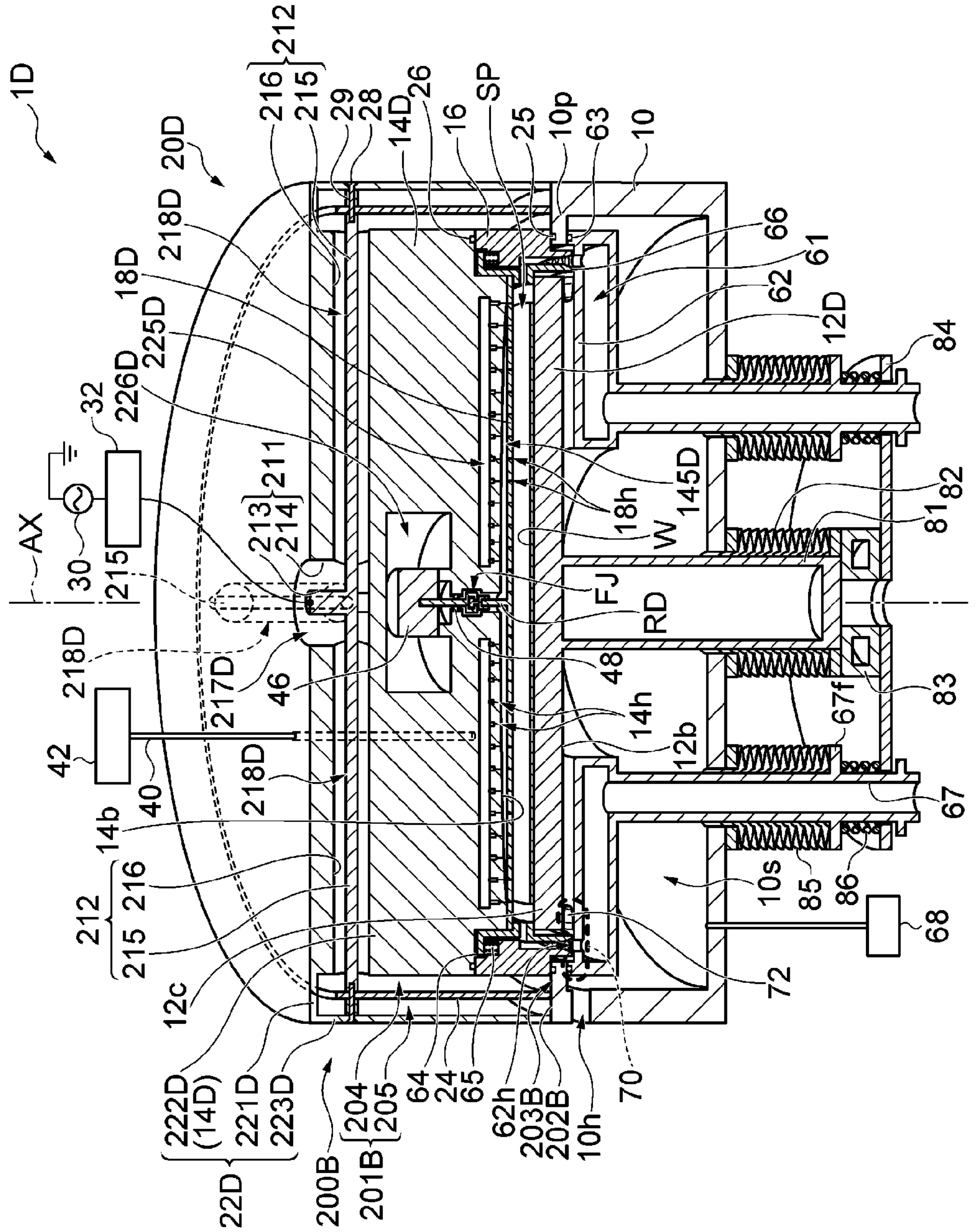
FIG. 6 is a view schematically illustrating a plasma processing apparatus according to still another exemplary embodiment.
Figure 7:
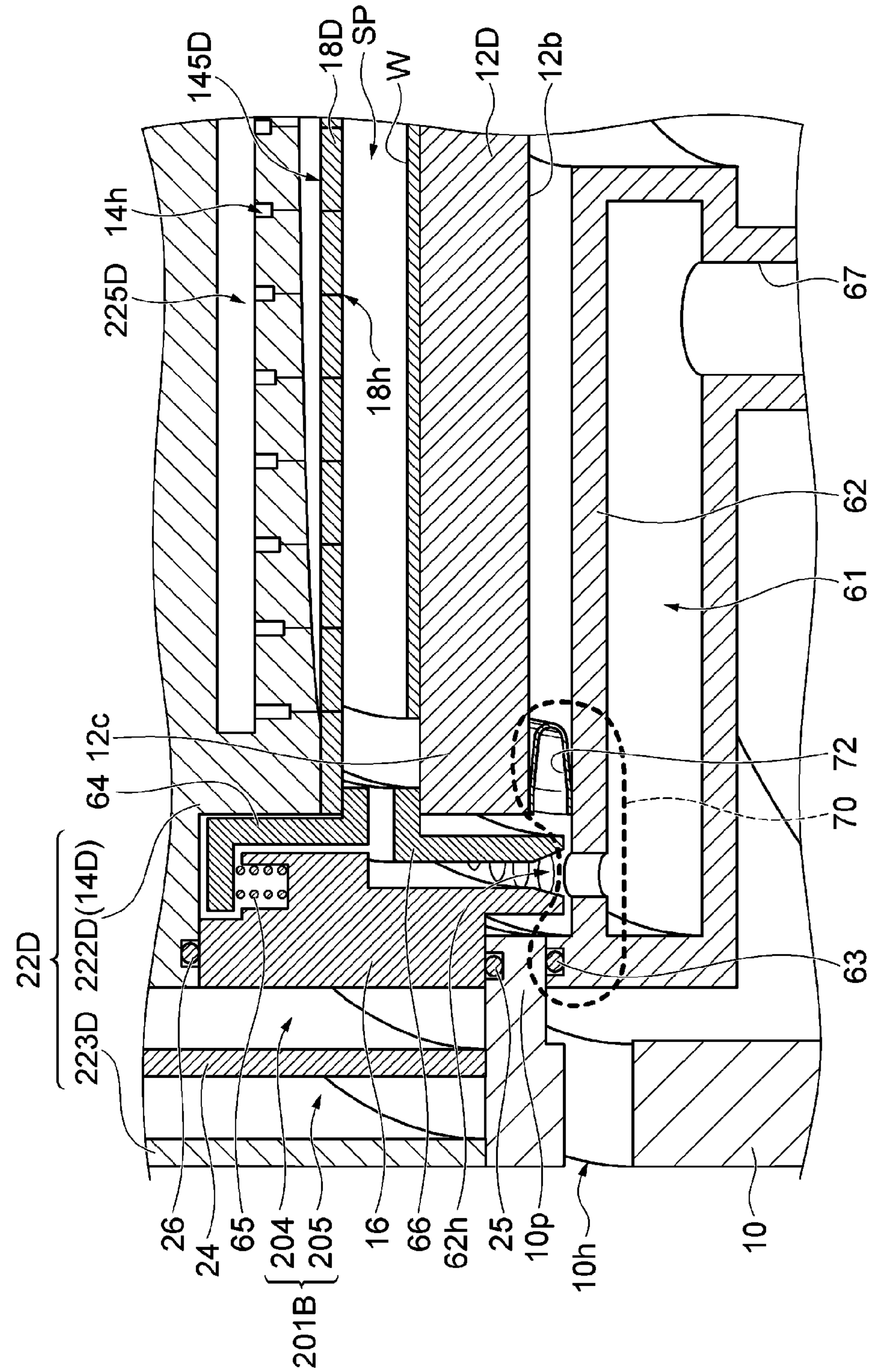
FIG. 7 is an enlarged view illustrating a part of the plasma processing apparatus of the exemplary embodiment illustrated in FIG. 6.

Hereinafter, a plasma processing apparatus 1D according to still another exemplary embodiment will be described with reference to FIGS. 6 and 7. FIG. 6 is a view schematically illustrating a plasma processing apparatus according to another exemplary embodiment. FIG. 7 is an enlarged view illustrating a part of the plasma processing apparatus of the exemplary embodiment illustrated in FIG. 6. Hereinafter, configuration of the plasma processing apparatus 1D that is different from the configuration of the plasma processing apparatus 1B will be described.

In the plasma processing apparatus 1D, a side wall of the processing container 10 has a protrusion 10*p*. The protrusion 10*p* constitutes an upper end of the side wall of the processing container 10. The protrusion 10*p* extends toward the axis AX in a direction intersecting the axis AX.

The protrusion 10*p* is connected to the wall 62 via a conductive elastic member 63. The wall 62 has conductivity. The wall 62 may be formed of a metal such as aluminum or an aluminum alloy. The conductive elastic member 63 is an elastic body. The material of the conductive elastic member 63 is, for example, a metal such as stainless steel, Inconel, nickel, tungsten, tantalum, a copper alloy, or molybdenum. The conductive elastic member 63 may be covered with a protective film of nickel, aluminum, stainless steel, gold, or the like. The conductive elastic member 63 is, for example, a spiral ring. The wall 62 defines an exhaust chamber 61.

The inlet 16 is provided on the protrusion 10*p*. As described above, the inlet 16 is formed of a dielectric material such as aluminum nitride or aluminum oxide. The inlet 16 has a ring shape. The inlet 16 is provided at the lateral end portion of the space SP. The inlet 16 is held between the upper end of the processing container 10 (i.e., the protrusion 10*p*) and a peripheral edge portion of the central portion 222D of a waveguide device 20D to be described later via the sealing member 25 and the sealing member 26.

The plasma processing apparatus 1D includes a stage 12D in place of the stage 12. The stage 12D is provided in the processing container 10. The stage 12D is configured to support a substrate W placed substantially horizontally on a top surface thereof. The stage 12D has a substantially disk-like shape. A central axis of the stage 12D may substantially coincide with the axis AX.

The plasma processing apparatus 1D includes an upper electrode 14D and a dielectric plate 18D in place of the upper electrode 14B and the dielectric plate 18. The upper electrode 14D is provided above the stage 12, to interpose the space SP within the processing container 10. The upper electrode 14D is formed of a conductor such as aluminum or an aluminum alloy. The upper electrode 14D has a substantially disk-like shape. A central axis of the upper electrode 14D substantially coincides with the axis AX. The upper electrode 14D is formed by a central portion 222D of the waveguide device 20D, which will be described later.

The dielectric plate 18D has a flat plate shape and is flexible. The dielectric plate 18D is formed of aluminum nitride, aluminum oxide, yttrium oxide, or a dielectric material containing aluminum nitride, aluminum oxide, yttrium oxide, and the like. A corrosion-resistant film may be formed on at least a bottom surface among surfaces of the dielectric plate 18D. The corrosion-resistant film may be an yttrium oxide film, an yttrium fluoride oxide film, an yttrium fluoride film, or a ceramic film containing yttrium oxide, yttrium fluoride, and the like. Similar to the dielectric plate 18, multiple gas discharge holes 18*h* are formed in the dielectric plate 18D. That is, in an embodiment, the dielectric plate 18D may be a shower plate configured to eject a gas. The dielectric plate 18D has a substantially disk-like shape.

The upper electrode 14D and the dielectric plate 18D provide a gap 145D therebetween. The length of the gap 145D in the vertical direction depends on a position in the radial direction with respect to the axis AX. That is, the length of the gap 145D in the vertical direction is not uniform (constant), but non-uniform. In an embodiment, the length of the gap 145D in the vertical direction is the largest on the axis AX, and decreases with distance from the axis AX. In this embodiment, the bottom surface 14*b* of the upper electrode 14D that defines the gap 145D may extend along a conical surface.

In the plasma processing apparatus 1D, a distance in the vertical direction between the bottom surface of the dielectric plate 18D and the top surface of the stage 12D (the length of the space SP in the vertical direction) may be, for example, 5 mm or more and 15 mm or less.

The plasma processing apparatus 1D further includes a support ring 64. The support ring 64 is a member that brings a peripheral edge portion of the dielectric plate 18D into close contact with the upper electrode 14D. The support ring 64 is formed of an insulating material such as aluminum oxide. The support ring 64 is held between the central portion 222D and the inlet 16. An elastic member 65 is interposed between the support ring 64 and the inlet 16. Therefore, the dielectric plate 18D is elastically held between the upper electrode 14D and the inlet 16. The elastic member 65 may be one or more coil springs. The elastic member 65 may be an O-ring.

The plasma processing apparatus 1D further includes a cover ring 66. The cover ring 66 is a member that holds the position of the stage 12D. The cover ring 66 is made of an insulating material such as aluminum oxide. The cover ring 66 prevents plasma from being generated near a side surface of the stage 12D.

In the example illustrated in FIGS. 6 and 7, the stage 12D may be formed of a conductive material such as aluminum or an aluminum alloy.

The plasma processing apparatus 1D further includes a conductive portion 70. The conductive portion 70 extends between a peripheral edge portion 12*c* of the stage 12D and the side wall of the processing container 10. The conductive portion 70 is electrically connected to the peripheral edge portion 12*c* of the stage 12D and the side wall of the processing container 10.

The conductive portion 70 extends from the peripheral edge portion 12*c* toward the side wall of the processing container 10 such that high-frequency waves radiated from the inlet 16 are introduced into the space SP. The conductive portion 70 includes a conductive plate 72. The conductive portion 70 includes a part of the wall 62 that defines the exhaust chamber 61.

The conductive plate 72 is in electrical contact with the rear surface 12*b* in the peripheral edge portion 12*c* of the stage 12D. The conductive plate 72 is a flexible thin plate. The material of the conductive plate 72 is, for example, a conductive material such as aluminum, an aluminum alloy, stainless steel, Inconel, nickel, tungsten, tantalum, a copper alloy, or molybdenum. The conductive plate 72 may be coated with a protective film of, for example, aluminum oxide, yttrium oxide, yttrium fluoride oxide, yttrium fluoride, nickel, aluminum, stainless steel, or gold. The conductive plate 72 is fixed to the rear surface of the peripheral edge portion 12*c* (the rear surface 12*b*) and a top surface of the wall 62 by screws.

As described above, the wall 62 defines the exhaust chamber 61. The exhaust chamber 61 extends from periphery of the peripheral edge portion 12*c* toward the side wall of the processing container 10. The exhaust chamber 61 communicates with the space SP. The exhaust chamber 61 communicates with an exhaust pipe 67.

The exhaust pipe 67 is connected to an exhaust apparatus. The exhaust apparatus is provided outside the processing container 10. The exhaust apparatus may include a pressure control valve and a vacuum pump such as a turbo molecular pump and/or a dry pump.

Multiple ventilation holes 62*h* are formed in the wall 62. The space SP communicates with the exhaust chamber 61 via the multiple ventilation holes 62*h*. The gas in the space SP is capable of moving to the exhaust chamber 61 through the ventilation holes 62*h*, and being discharged to the outside of the processing container 10 through the exhaust pipe 67.

An opening 10*h* is formed in the side wall of the processing container 10. A substrate W is transported between the inside and the outside of the processing container 10 through the opening 10*h*. The space 10*s* inside the processing container 10 communicates with the outside of the processing container 10 through the opening 10*h*, and also communicates with a gas supply apparatus 68. The gas supply apparatus 68 is capable of supplying a purge gas such as an Ar gas into the space 10*s*.

The plasma processing apparatus 1D further includes a support 81. The support 81 is connected to the stage 12D. The stage 12D is provided on the support 81. The support 81 penetrates the bottom of the processing container 10 and extends to the lower side of the processing container 10. When the support 81 is moved up and down, the stage 12D is moved up and down.

A water-cooling plate 83 is disposed below the support 81. The support 81 is in contact with the water-cooling plate 83. The water-cooling plate 83 is mounted on a bottom plate 84. The bottom plate 84 has a substantially disk-like shape. The heat of the stage 12D can be discharged to the outside through the support 81 and the water-cooling plate 83. A bellows 82 is provided between the water-cooling plate 83 and the bottom of the processing container 10. The bellows 82 extends so as to surround the support 81. The bellows 82 seals a hole in the bottom of the processing container 10 through which the support 81 passes.

The exhaust pipe 67 is connected to the wall 62, and communicates with the exhaust chamber 61. The wall 62 is provided on the exhaust pipe 67. The gas in the exhaust chamber 61 is capable of being discharged to the outside through the exhaust pipe 67. The exhaust pipe 67 penetrates the bottom of the processing container 10 and the bottom plate 84 and extends to the lower side of the processing container 10. When the exhaust pipe 67 is moved up and down, the exhaust chamber 61 and the wall 62 are moved up and down.

The exhaust pipe 67 has a flange 67*f* between upper and lower ends thereof. A bellows 85 is provided between the flange 67*f* and the bottom of the processing container 10. The bellows 85 extends so as to surround the exhaust pipe 67. The bellows 85 seals a hole in the bottom of the processing container 10 through which the exhaust pipe 67 passes. The material of the bellows 85 may be a conductive material such as stainless steel. A spring 86 is provided between the flange 67*f* and the bottom plate 84. The material of the spring 86 may be a conductive material such as stainless steel.

The wall 62 is pressured upward by a spring 86. That is, the wall 62 is, due to the elasticity of the spring 86, capable of being stably disposed on the upper electrode 14 side (the upper side). Accordingly, the peripheral edge portion of the wall 62 is in close contact with the rear surface of the protrusion 10*p*. Further, due to the elasticity of the conductive elastic member 63, the peripheral edge portion of the wall 62 and the protrusion 10*p* can be in stable electrical contact with each other.

When performing plasma processing using the plasma processing apparatus 1D, high-frequency waves are introduced into the space SP from the inlet 16 in a state in which the peripheral edge portion 12*c* of the stage 12D and the side wall of the processing container 10 are electrically connected via the conductive portion 70. Plasma processing is performed by the plasma generated by an electric field based on the high-frequency waves introduced in this way.

In the plasma processing apparatus 1D, the conductive portion 70 is connected to the side wall of the processing container 10, and is therefore grounded. Accordingly, the conductive portion 70 may have an electrical shielding function. The conductive portion 70 extends between the peripheral edge portion 12*c* of the stage 12D and the side wall of the processing container 10. Therefore, the high-frequency waves radiated from the inlet 16 toward the space SP, without being diffused to an area extending below the stage 12D, can be efficiently introduced into the space SP. As a result, high-frequency waves of sufficient intensity can be supplied to the space SP.

In an embodiment, the conductive portion 70 is in electrical contact with the peripheral edge portion 12*c* of the stage 12D via the flexible conductive plate 72. Therefore, even if the position of the conductive portion 70 changes, the electrical contact between the conductive portion 70 and the peripheral edge portion 12*c* of the stage 12D can be reliably maintained.

In an embodiment, multiple gas holes 14*h* and a cavity 225D may be formed in the upper electrode 14D. The cavity 225D communicates with the gas supply 42 via the pipe 40. The multiple gas holes 14*h* communicate with the cavity 225D. The multiple gas holes 14*h* extend downward from the cavity 225D and provide lower end openings thereof at the bottom surface of the upper electrode 14D. The multiple gas holes 14*h* communicate with the gap 145D.

In an embodiment, the lower end openings of the multiple gas holes 14*h* are disposed so as to face upper end openings of corresponding gas discharge holes among the multiple gas discharge holes 18*h*. According to this embodiment, even if it is difficult for a gas to diffuse horizontally in the gap 145D due to a short length of the gap 145D in the vertical direction, the gas easily flows from each of the multiple gas holes 14*h* to the corresponding gas discharge hole.

A dielectric rod RD is provided between the upper electrode 14D and the dielectric plate 18D. The dielectric rod RD may be disposed on the axis AX. The dielectric rod RD extends along the axis AX. The dielectric rod RD may be joined to the dielectric plate 18D or may be integrated with the dielectric plate 18D.

The dielectric rod RD is connected to the actuator 46 via a floating joint FJ. A sealing member 48 such as an O-ring is provided between the floating joint FJ and the central portion 222D. A cavity 226D is formed in the upper electrode 14D. The actuator 46 is disposed in the cavity 226D. The actuator 46 moves the dielectric rod RD up and down via the floating joint FJ. The dielectric plate 18D moves up and down in conjunction with the up-and-down movement of the dielectric rod RD, except for a peripheral edge portion thereof, which is in close contact with the upper electrode 14D. As a result, the length of the gap 145D in the vertical direction is adjusted according to a radial distance with respect to the axis AX.

The plasma processing apparatus 1D includes a waveguide device 20D in place of the waveguide device 20B. The waveguide device 20D includes a resonator 200B like the waveguide device 20B. The waveguide device 20D may further include a first coaxial waveguide 211 and a plurality of second coaxial waveguides 212, similarly to the waveguide device 20B.

In the plasma processing apparatus 1D, the waveguide 201B of the resonator 200B is provided by a main portion 22D and a cylindrical member 24. The main portion 22D includes an upper wall portion 221D, a central portion 222D, and an outer cylindrical portion 223D, which are similar to the upper wall portion 221B, the central portion 222B, and the outer cylindrical portion 223B, respectively. However, unlike the central portion 222B, the central portion 222D constitutes the upper electrode 14D.

A hole 217D extending along the axis AX is formed in the central portion 222D. The portion defining the hole 217D in the central portion 222D is the outer conductor 214 of the first coaxial waveguide 211. The inner conductor 213 of the first coaxial waveguide 211 extends along the center line of the hole 217D, that is, the axis AX.

In the central portion 222D, multiple holes 218D extending in the radial direction with respect to the axis AX are formed. The multiple holes 218D are arranged at an angular interval of about 360 degrees/N in the circumferential direction with respect to the axis AX. As described above, "N" is the number of second coaxial waveguides 212. The portions defining the multiple holes 218D in the central portion 222D are the outer conductors 216 of the multiple second coaxial waveguides 212. In the multiple holes 218D, the multiple inner conductors 215, that is, the inner conductors of the multiple second coaxial waveguides 212, are extended respectively. The multiple inner conductors 215 branch from the inner conductor 213 and extend radially with respect to the axis AX.

Although various examples of embodiments have been described above, the present disclosure is not limited to the exemplary embodiments described above, and various omissions, substitutions, and changes may be made. In addition, elements in different embodiments may be combined to form other embodiments.

From the foregoing, it should be understood that various embodiments of the present disclosure have been described herein for purposes of illustration, and that various modifications can be made without departing from the scope and spirit of the present disclosure. Accordingly, the various embodiments disclosed herein are not intended to be limiting, and the true scope and spirit of the disclosure are indicated by the appended claims.

EXPLANATION OF REFERENCE NUMERALS

1: plasma processing apparatus, 10: processing container, 12: stage, 14: upper electrode, 16: inlet, 20: waveguide device, 200: resonator

What is claimed is:

1. A plasma processing apparatus comprising:

a processing container;

a stage provided within the processing container;

an upper electrode provided above the stage, to interpose a space within the processing container;

a dielectric plate having a disk shape, provided above the stage and below the upper electrode, and including a central portion and a peripheral edge portion having a thickness greater than a thickness of the central portion, wherein the peripheral edge portion is an inlet configured to introduce high-frequency waves that are VHF waves or UHF waves toward a central axis of the processing container, the inlet being provided at an end of the space in a lateral direction and extending in a circumferential direction around the central axis; and a waveguide device configured to supply the high-frequency waves to the inlet, wherein the waveguide device includes a resonator that provides a waveguide, the waveguide of the resonator extends in the circumferential direction around the central axis and extends in a direction in which the central axis extends to be connected to the inlet, the waveguide includes one end and another end in the direction in which the central axis extends, and the another end of the waveguide is connected to the inlet.

2. The plasma processing apparatus of claim 1, wherein the waveguide has a tubular shape.

3. The plasma processing apparatus of claim 2, wherein a width of the waveguide between the one end and the other end is about ½ of a free space wavelength of the high-frequency waves supplied to the waveguide.

4. The plasma processing apparatus of claim 3, wherein the waveguide is folded back in the direction in which the central axis extends.

5. The plasma processing apparatus of claim 4, wherein the waveguide includes multiple coaxial waveguides extending radially with respect to the central axis and connected to the waveguide, and the multiple coaxial waveguides are arranged at equal intervals in the circumferential direction.

6. The plasma processing apparatus of claim 5, wherein the waveguide further includes another coaxial waveguide extending on the central axis and connected to the multiple coaxial waveguides.

7. The plasma processing apparatus of claim 6, wherein the dielectric plate is a shower plate configured to eject a gas into the processing container.

8. The plasma processing apparatus of claim 7, further comprising:

a pipe extending through the waveguide device in order to supply the gas to the shower plate, wherein a metal wall of the waveguide device is grounded.

9. The plasma processing apparatus of claim 1, wherein a width of the waveguide between the one end and the other end is about ½ of a free space wavelength of the high-frequency waves supplied to the waveguide.

10. The plasma processing apparatus of claim 1, wherein the waveguide is folded back in the direction in which the central axis extends.

11. The plasma processing apparatus of claim 1, wherein the waveguide includes multiple coaxial waveguides extending radially with respect to the central axis and connected to the waveguide, and the multiple coaxial waveguides are arranged at equal intervals in the circumferential direction.

* * * * *